US008868936B2

(12) United States Patent
Nelluri et al.

(10) Patent No.: US 8,868,936 B2
(45) Date of Patent: Oct. 21, 2014

(54) DYNAMIC POWER BALANCING AMONG BLADE SERVERS IN A CHASSIS

(75) Inventors: Chakravarthy Nelluri, Santa Clara, CA (US); Amitava Guha, San Jose, CA (US); Krishna Mohan, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 509 days.

(21) Appl. No.: 12/955,002

(22) Filed: Nov. 29, 2010

(65) Prior Publication Data

US 2012/0137158 A1    May 31, 2012

(51) Int. Cl.
*G06F 1/32* (2006.01)
*H05K 7/14* (2006.01)

(52) U.S. Cl.
CPC ............ *G06F 1/3203* (2013.01); *G06F 1/3287* (2013.01); *H05K 7/1498* (2013.01); *Y02B 60/1282* (2013.01)
USPC ......................................................... 713/300

(58) Field of Classification Search
CPC ....................................................... G06F 1/32
USPC ......................................................... 713/300
See application file for complete search history.

(56) References Cited

U.S. PATENT DOCUMENTS

| | | | |
|---|---|---|---|
| 6,121,693 A | 9/2000 | Rock | |
| 6,308,240 B1 | 10/2001 | De Nicolo | |
| 6,661,671 B1 * | 12/2003 | Franke et al. | 361/752 |
| 7,053,501 B1 | 5/2006 | Barrass | |
| 7,400,062 B2 * | 7/2008 | Pincu et al. | 307/29 |
| 7,457,976 B2 * | 11/2008 | Bolan et al. | 713/300 |
| 7,549,067 B2 * | 6/2009 | Tolliver | 713/320 |
| 7,992,011 B2 * | 8/2011 | Yasuda et al. | 713/300 |
| 7,996,690 B2 * | 8/2011 | Shetty et al. | 713/300 |
| 8,224,993 B1 * | 7/2012 | Brandwine | 709/244 |
| 2004/0255171 A1 | 12/2004 | Zimmer et al. | |
| 2005/0283624 A1 | 12/2005 | Kumar et al. | |
| 2009/0132842 A1 | 5/2009 | Brey et al. | |

OTHER PUBLICATIONS

EP Search Report and Written Opinion in Corresponding PCT/US2011/031912 dated Aug. 9, 2011.

* cited by examiner

*Primary Examiner* — Kim Huynh
*Assistant Examiner* — Eric Chang
(74) *Attorney, Agent, or Firm* — Edell, Shapiro & Finnan, LLC

(57) ABSTRACT

Techniques are provided to redistribute and rebalance power to a plurality of blade servers with a chassis unit. At a chassis management controller device in a chassis unit comprising a plurality of blade server devices, policy information is stored for the chassis unit. The policy information comprises power limit information that indicates a power budget for the chassis unit and blade server priority information that indicates priority for access to power for each of the plurality of blade servers in the chassis unit. Power is distributed to the plurality of blade servers based on the blade server priority information for each of the plurality of blade servers and the power limit information for the chassis unit. The actual power consumption of each of the plurality of blade servers is determined and power is redistributed to the plurality of blade servers based on the actual power consumption and the policy information.

21 Claims, 8 Drawing Sheets

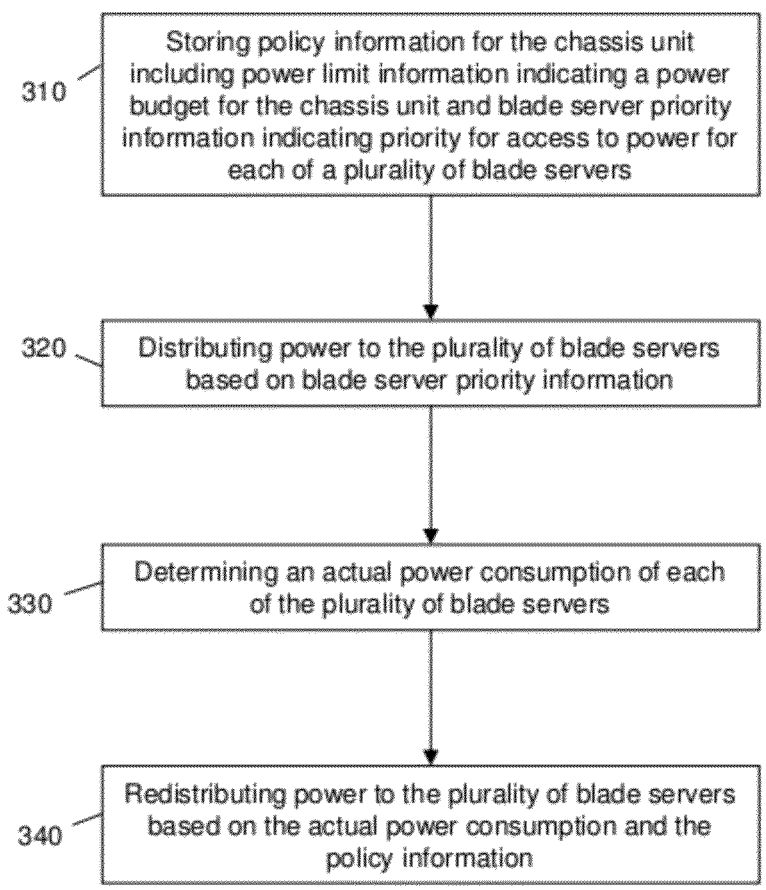

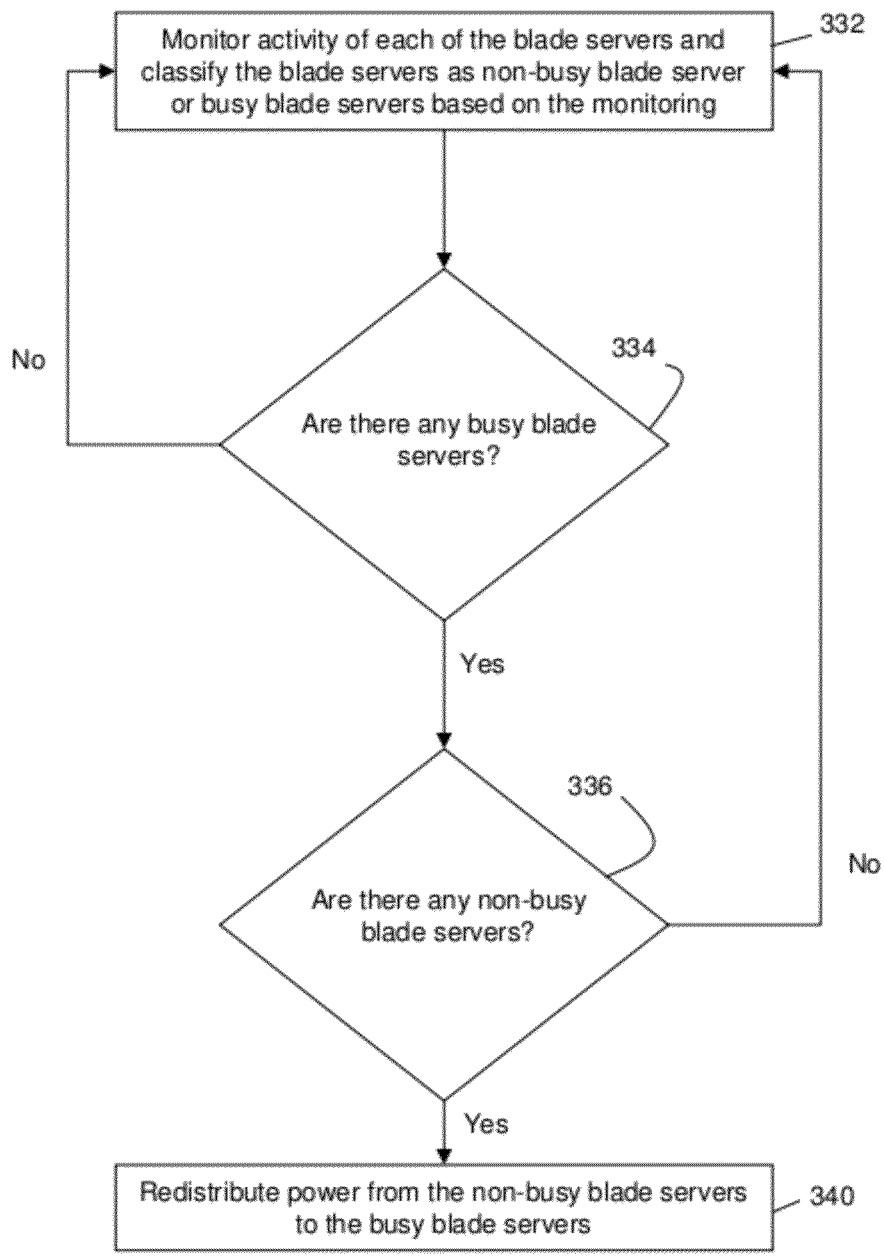

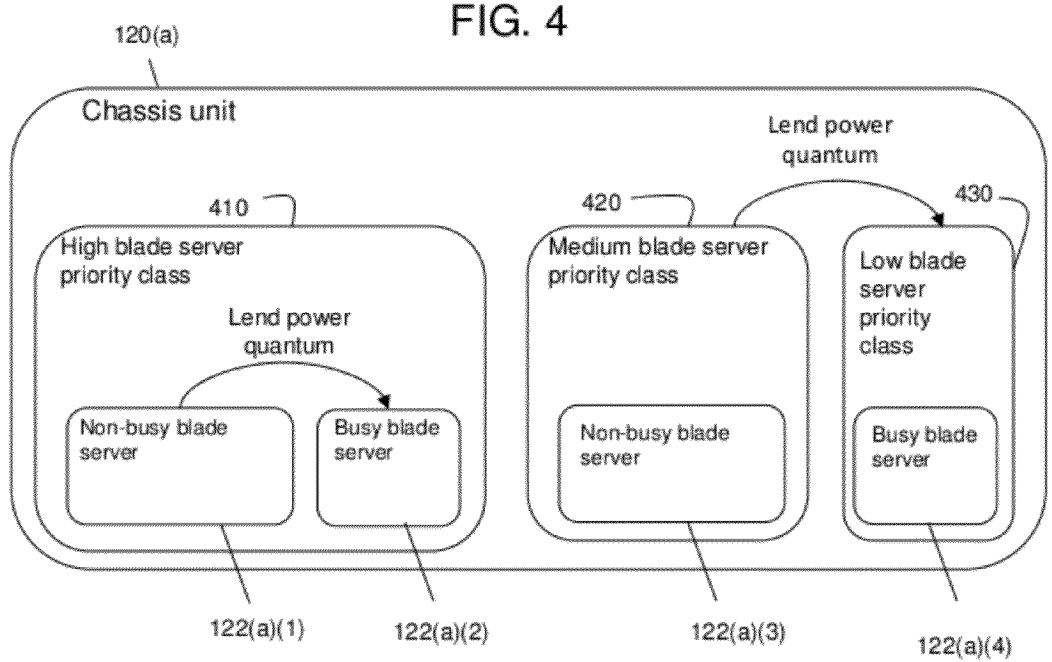

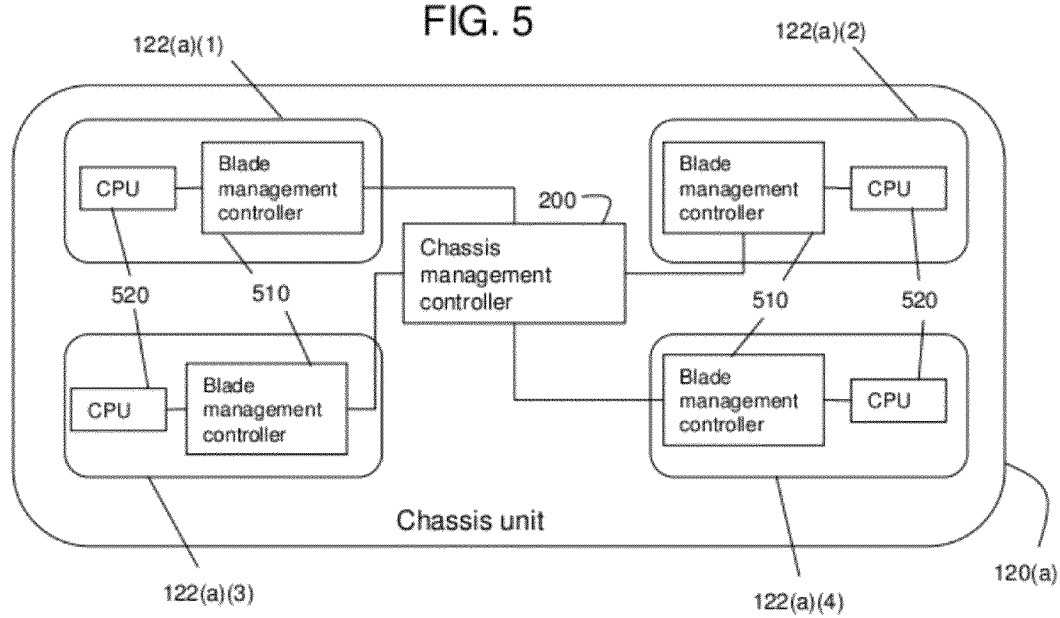

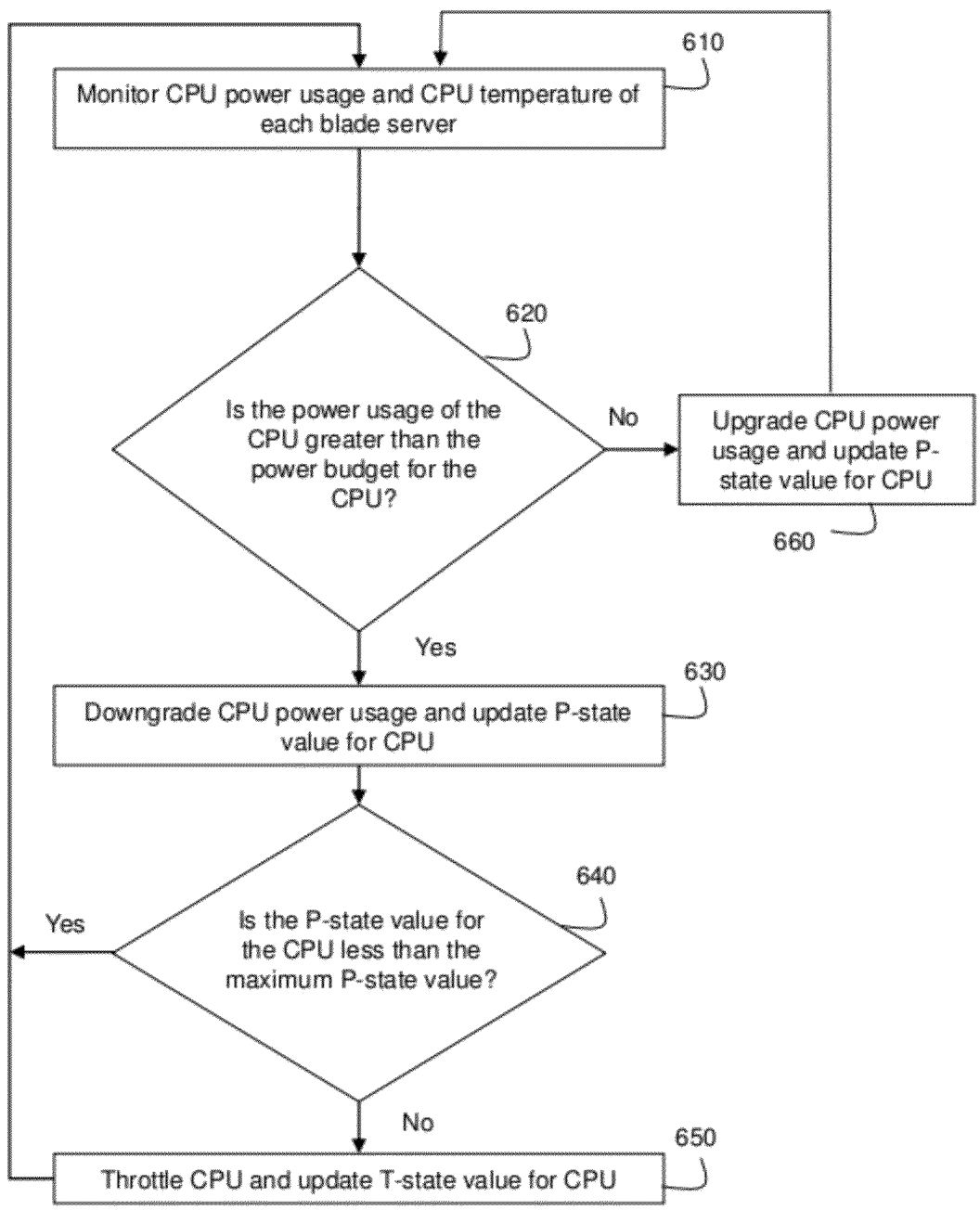

DYNAMIC POWER BALANCING AMONG BLADE SERVERS IN A CHASSIS

TECHNICAL FIELD

The present disclosure relates to data center power allocation and power balancing across blade servers in a chassis.

BACKGROUND

Computer servers or so-called "blade" servers may be used in data centers to optimize space and energy consumption. Multiple blade servers may be housed in a chassis unit. For example, the chassis unit may manage the multiple blade servers by providing power, cooling, networking and other management of the servers.

Traditionally, there is no limit enforced by a data center or chassis unit on the amount of power that the blade servers can consume. As a result, blade servers are often allocated with more power than they actually use. In order to avoid unnecessary power allocation to the blade servers, power capping may be used to reduce the amount of electricity or power that servers can consume at a given time by enforcing power consumption limits. Ultimately, this can reduce the electricity costs of running the blade servers. When power capping is used, however, servers might not have enough power to run at their peak performance level, and as a result, power capping may cause performance degradation.

BRIEF DESCRIPTION OF THE DRAWINGS

FIG. 3A is an example of a flow chart depicting operations of the power redistribution logic executed in the chassis management controller apparatus.

FIG. 3B is an example of a flow chart depicting determination of the actual power consumption of the blade servers and the status of the blade servers.

FIG. 4 is an example of a diagram showing power redistribution between blade servers in different blade server priority classes.

FIG. 5 is an example of a block diagram of a plurality of blade servers in a chassis unit with a corresponding central processing unit (CPU) and a corresponding blade management controller to regulate power usage of the blade server.

FIG. 6 is an example of a flow chart depicting how the the CPU temperature and power usage of each blade server is used to manage power usage of the blade server.

DESCRIPTION OF EXAMPLE EMBODIMENTS

Overview

Techniques are provided to redistribute and rebalance power to a plurality of blade servers in a chassis unit. At a chassis management controller device in a chassis unit comprising a plurality of blade server devices, policy information is stored for the chassis unit. The policy information comprises power limit information that indicates a power budget for the chassis unit and blade server priority information that indicates priority for access to power for each of the plurality of blade servers. Power is distributed to the plurality of blade servers based on the blade server priority information for each of the plurality of blade servers and the power limit information for the chassis unit. The actual power consumption of each of the plurality of blade servers is determined and power is redistributed to the plurality of blade servers based on the actual power consumption and the policy information.

Example Embodiments

Figure 1:
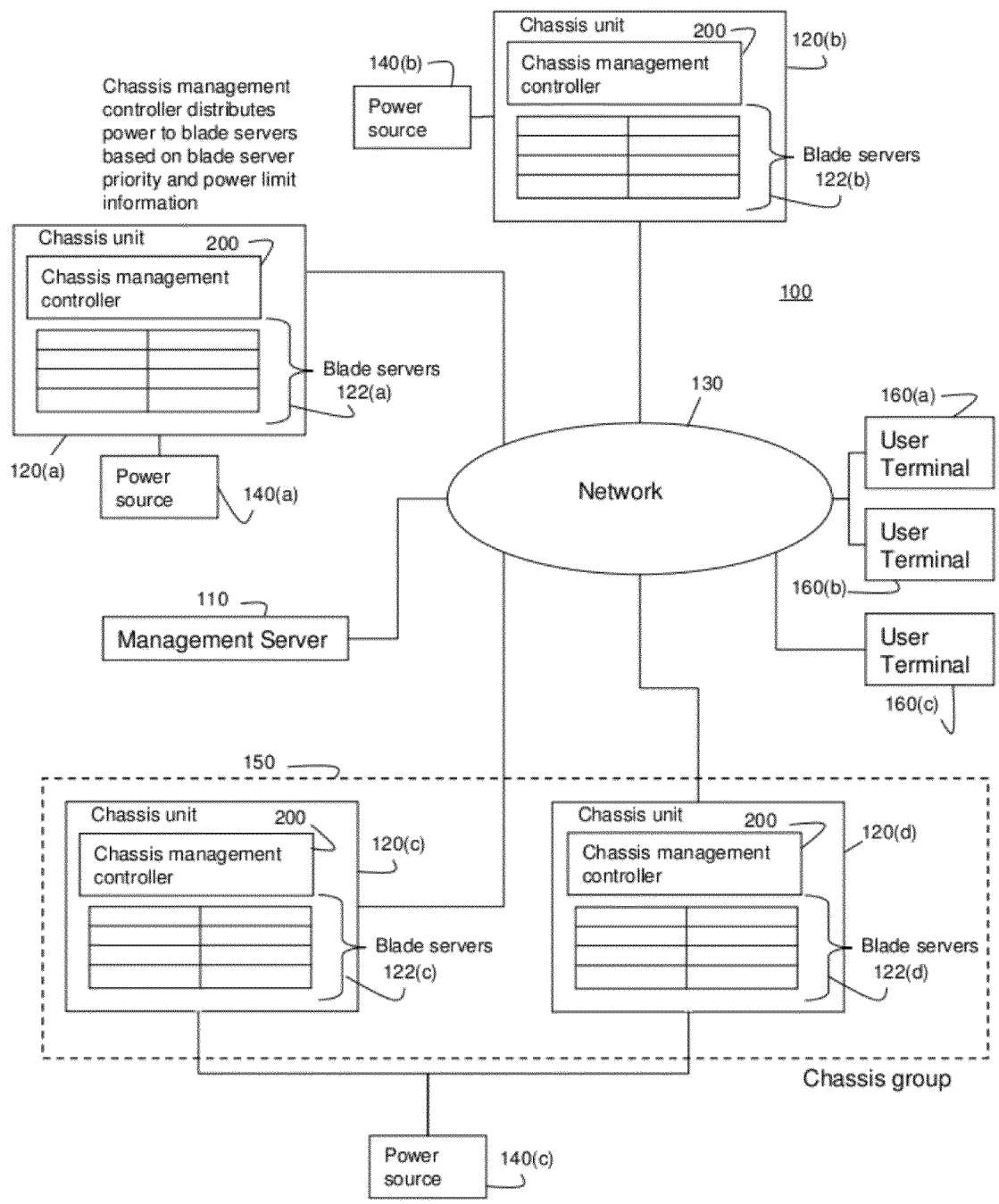
FIG. 1 shows an example of a network environment for power management of a plurality of chassis units each comprising a chassis management controller that is configured to store policy information received from a management server and to allocate power to a plurality of blade servers in each of the chassis units based on the policy information.

Referring first to FIG. 1, a system for managing and distributing power for chassis units is shown at 100. The system 100 comprises a management server shown at reference numeral 110 and a plurality of chassis units shown at reference numerals 120(*a*)-120(*d*). Each of the plurality of chassis units houses a plurality of blade servers, shown at reference numerals 122(*a*)-122(*d*), and a chassis management controller device, shown at reference numeral 200. Thus, reference numeral 122(*a*) identifies a plurality of blade servers in chassis 120(*a*), reference numeral 122(*b*) identifies a plurality of blade servers in chassis 120(*b*), and so on. The chassis management controller device 200 may be configured, for example, to perform blade server power redistribution to distribute power to the plurality of blade servers in each respective chassis unit, as described hereinafter. The management server 110 communicates with the plurality of chassis units 120(*a*)-120(*d*) via network 130. For example, the management server 110 may send policy information to the chassis units 120(*a*)-120(*d*) that comprises power budget and blade server priority information for each of the chassis units 120(*a*)-120(*d*).

FIG. 1 also shows a plurality of power source units at reference numerals 140(*a*)-140(*c*), which are configured to supply power to respective chassis units 120(*a*)-120(*d*). Typically, power is supplied to each of the chassis units individually by separate power source units. However, a power source unit, such as power source unit 140(*c*), may supply power to one or more chassis units comprising a chassis group. This example is illustrated in FIG. 1, where power source 140(*c*) supplies power to chassis group 150, and the chassis group comprises multiple chassis units, e.g., chassis unit 120(*c*) and 120(*d*). Finally, FIG. 1 shows a plurality of user terminal devices 160(*a*)-160(*c*) that are configured to communicate with any one of more of the pluralities of blade servers 122(*a*)-122(*d*) in the plurality of chassis units across network 130.

Figure 2:
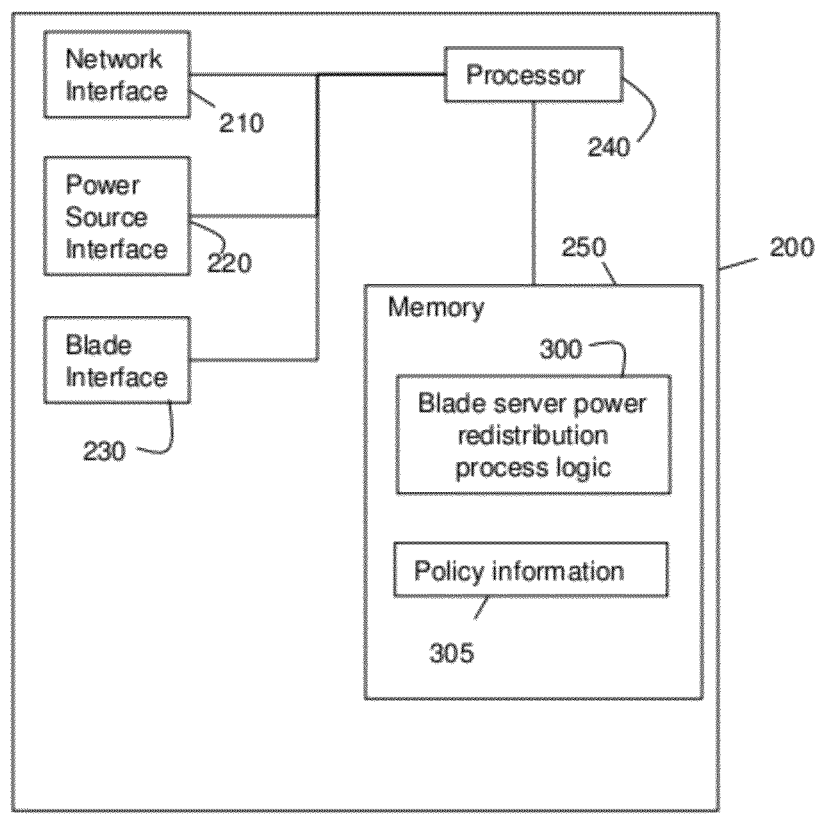
FIG. 2 is an example of a block diagram of the chassis management controller apparatus that is configured with blade server power redistribution process logic to distribute power to the plurality of blade servers based on the relative priority of the blade servers and the power consumption of the blade servers.

Turning to FIG. 2, an example of the chassis management controller device 200 is shown. The chassis management controller device 200 comprises a network interface device 210, a power source interface device 220, a blade interface device 230, a processor 240 and a memory 250. The network interface device 210 is configured to enable communications over network 130 to, among other things, receive policy information from management server 110. As described hereinafter, the chassis management controller device 200 receives policy information that contains power limit information, for example, indicating a power budget for each of the plurality of blade servers in the chassis unit that the chassis management controller device 200 serves. The policy information also may contain information such as blade server priority information that indicates, for example, priority for blade servers in each chassis unit to access power.

The power source interface 220 is configured to receive power from a power source, e.g., one of the power sources 140(*a*)-140(*c*). This power is ultimately to be supplied and distributed to the plurality of blade servers 122(*a*)-122(*d*) in the plurality of chassis units 120(a)-120(d) under control of the chassis management controller device 200.

The blade server interface 230 allows for the chassis management controller device 200 to communicate with the plurality of blade servers within each chassis unit, for example, to monitor the blade server power consumption, determine blade server priority information and to distribute power to the blade servers. In another form, the chassis management controller 200 may communicate with the plurality of blade servers in its chassis unit via the network 130.

Processor 240 is coupled to the network interface device 210, to the power source interface device 220, to the blade server interface 230 and to memory 250. Processor 240 is, for example, a microprocessor or microcontroller that is configured to execute program logic instructions (i.e., software) for carrying out various operations and tasks described herein. For example, the processor 240 is configured to execute blade server power redistribution logic 300 that is stored in memory 250 in order to distribute power to the plurality of blade servers based on the blade server priority and status information. The memory 250 may comprise read only memory (ROM), random access memory (RAM), magnetic disk storage media devices, optical storage media devices, flash memory devices, electrical, optical, acoustical or other physical/tangible memory storage devices.

The functions of processor 240 may be implemented by logic encoded in one or more tangible computer readable media (e.g., embedded logic such as an application specific integrated circuit, digital signal processor instructions, software that is executed by a processor, etc), wherein memory 250 stores data used for the operations described herein and stores software or processor executable instructions that are executed to carry out the operations described herein.

The blade server power redistribution process logic 300 may take any of a variety of forms, so as to be encoded in one or more tangible computer readable memory media or storage device for execution, such as fixed logic or programmable logic (e.g., software/computer instructions executed by a processor) and the processor 240 may be an application specific integrated circuit (ASIC) that comprises fixed digital logic, or a combination thereof. For example, the processor 240 may be embodied by digital logic gates in a fixed or programmable digital logic integrated circuit, which digital logic gates are configured to perform the blade server power redistribution logic 300. In sum, the blade server power redistribution logic 300 may be embodied in one or more tangible computer readable storage media encoded with software comprising computer executable instructions and when the software is executed operable to perform the operations described herein for the logic 300.

Also stored in memory 250 is policy information 305 that is received by the chassis management controller 200 from the management server 110. In general, the policy information 305 may be used by the chassis management controller device 200 to enforce power limits on the blade servers of each chassis unit. As described in detail herein, the policy information may comprise power limit information that indicates a power budget for each of the chassis units and blade priority information that indicates priority for access to power for each of the plurality of blade servers in each chassis unit. Memory 250 may also store information pertaining to the status of each blade server based on the actual power consumption of each of the plurality of blade servers in each chassis unit. The policy information, status and power consumption information are used, for example, by processor 240 to execute the blade server power redistribution logic 300, the techniques of which are described herein.

In general, the chassis management controller 200 provides management services for the plurality of blade servers in its chassis unit. The chassis management controller 200 distributes power to the blade servers of the chassis based on the priority of the blade. For example, a blade with a higher priority classification will receive more power than a blade with a lower priority classification. Also, in another example, a "busy" blade server (i.e., a blade server that is consuming much of its allocated power) will be allocated more power than a "non-busy" blade server (i.e., a blade server that is consuming little of its allocated power).

Operation of the blade server power redistribution process logic 300 is described hereinafter in connection with the flow charts of FIGS. 3A, 3B and 3C, with continued reference to FIGS. 1 and 2.

Reference is now made to FIG. 3A for a description of the blade server power redistribution process logic 300. Blade server power redistribution process logic 300 is used for performing power distribution and redistribution to the plurality of blade servers based on blade server priority and status information. At 310, the chassis management controller 200 stores, in memory 250, policy information, received from management server 110, for the chassis unit in which it resides. The policy information (shown at 205 in FIG. 2) includes power limit information indicating a power budget for the chassis unit and blade server priority information indicating priority for access to power for each of a plurality of blade servers in the chassis unit. For example, the policy information may assign different chassis units with different power budgets based on, among other criteria, the total number of blade servers in each chassis unit, the priority of the blade servers within the chassis unit and the number of blade server slots in each chassis unit.

Likewise, the policy information may assign different blade servers within each chassis unit to one of a plurality of priority classes for access to power. For example, some blade servers within a chassis unit may be assigned to a high priority class while other blade servers are assigned to a medium priority class or a low priority class. Thus, in this example, chassis units with more blade servers in higher blade server priority classes may be allocated more power relative to other chassis units with fewer blade servers in higher blade server priority classes.

The chassis management controller 200 for each chassis unit 120(a)-120(d) may receive the policy information from a management server 110 that is located remotely from the each of the chassis units 120(a)-120(d). In another example, the management server 110 may define a chassis group comprising two or more of the chassis units 120(a)-120(d) (for example, chassis group 150 shown in FIG. 1 comprising chassis units 120(c) and 120(d)) and may define the policy information for the chassis group by setting a power limit for each of the chassis units of the chassis group and setting blade server priorities for each of the blade servers within the chassis units of the chassis group. Alternatively, the chassis management controller 200 for each chassis unit 120(a)-120(d) may receive the policy information containing the information described above from a user located remotely from each of the chassis unit. For example, the user may define, among other things, a power limit for a chassis unit or a group of chassis units and may define the priority of each blade server in each chassis unit.

Upon receiving the power budget information for the chassis unit, the chassis management controller 200 may reserve a predetermined amount of power from the power budget for chassis cooling and power purposes. The chassis management controller may then distribute the power remaining in the power budget to the plurality of blade servers as described herein. In one example, the chassis management controller 200 calculates the power that remains in the power budget (after reserving the predetermined amount of power for cooling) by using the following formula:

$$P_{C_{avail}} = P_{C_{limit}} - \left( P_{C_{reserved}} + \sum_{i=0}^{n=8} P_{bi_{min}} \right), \quad \text{(Equation 1)}$$

where
$P_{C_{limit}}$ is the Power limit on the chassis;
$P_{C_{avail}}$ is the Power available for the chassis;
$P_{C_{reserved}}$ is the Reserved power for the chassis; and
$P_{bi_{min}}$ is the minimum power limit on blade server i.

The remaining power is distributed to the plurality of blade servers based on a power limit that is assigned for each of the blade server priority classes. The power limit for each priority class may be set by first assigning a weight to each of the priority classes based on the number of servers of the chassis unit in each priority class. This allows for a weighted fair share of the remaining power of the power limit for each priority class. For example, if a chassis unit has all of its blade servers in a medium priority class, the chassis unit may have a higher power budget than a chassis unit with some blade servers in a high priority class and some blade servers in a low priority class. The chassis management controller 200 receives data within the policy information that indicates the priority classifications of the blade servers, and using that information, the chassis management controller 200 may then calculate the total weight for each priority class by the following formula:

$$W_{P_{i,total}} = W_{P_i} * n_{P_i} \quad \text{(Equation 2), where}$$

$W_{P_{i,total}}$ is the total weight for priority class i;
$W_{P_i}$ is the Weight of priority class I; and
$n_{P_i}$ is the Number of occupied blade server slots in each priority class.

In one example, a high priority class may be assigned a weight of priority class ($W_{pi}$) value of 3, a medium class may be assigned a weight of priority class value of 2, and a low priority class may be assigned a weight of priority class value of 1. After determining the total weight of each priority class, the power limit for each priority class may then be calculated, based on the following formula:

$$P_{P_i} = P_{C_{avail}} * \left( \frac{W_{P_{i,total}}}{\sum_{i=0}^{3} W_{P_{i,total}}} \right), \quad \text{(Equation 3)}$$

where
$P_{P_i}$ is the Power limit for priority class i; and
$W_{P_{i,total}}$ is the total weight for priority class i.

After the chassis management controller 200 receives the policy information and calculates the power limit for each priority class (for example, in accordance with Equation 3), then at 320, the chassis management controller 200 distributes power to the plurality of blade servers in accordance with the policy information. In one example, processor 240 distributes power received at the power source interface 220 to each of the blade servers based on the policy information. As stated above, the policy information received in step 310 may contain information or data that assigns each of the blade servers of the chassis unit to one or more of a plurality of blade server priority classes, wherein each priority class has a relative priority. Also as stated above, the blade servers of the chassis unit may be classified to one of three blade server priority classes comprising a high priority class, a medium priority class and a low priority class. The chassis management controller 200 may distribute power to each of the blade servers of the chassis unit based on its blade server priority class such that blade servers with a higher relative priority within the chassis unit receive more power than blade servers with a lower relative priority. In one example, blade servers that are classified in the same blade server priority class may receive an equal amount of power. For example, all the blade servers of a chassis unit that are classified in a low priority class may receive the same relative low power, the blade servers that are classified in a medium priority class may receive the same relative medium power and the blade servers that are classified in a high priority class may receive the same relative high power.

The chassis management controller 200 may also distribute power to the blade servers based on a number of blade slots in each respective chassis unit that is occupied by each of the blade servers. In general, the type of blade server will determine the number of blade slots in a chassis unit that the blade would occupy. Blade servers that occupy multiple blade slots may receive more power than blade servers that occupy a single blade slot. For example, a blade server which occupies two slots may receive twice the power than a blade which occupies one slot.

Thus, based on the power limit information for each blade server priority class (i.e., Equation 3, above) and information regarding the number of blade slots that each blade server occupies, the chassis management controller 200 may calculate the power allocation for each blade server based on the following formula:

$$P_{b_i} = P_{P_i} * \left( \frac{n_{P_i}}{\sum_{i=0}^{3} n_{P_i}} \right), \quad \text{(Equation 4)}$$

where
$P_{b_i}$ is the Power limit for blade server i;
$P_{P_i}$ is the Power limit for priority class i; and
$n_{P_i}$ is the Number of occupied blade server slots in each priority class. Based on this calculation, the chassis management controller 200 may distribute power to each blade server.

Figure 3C:
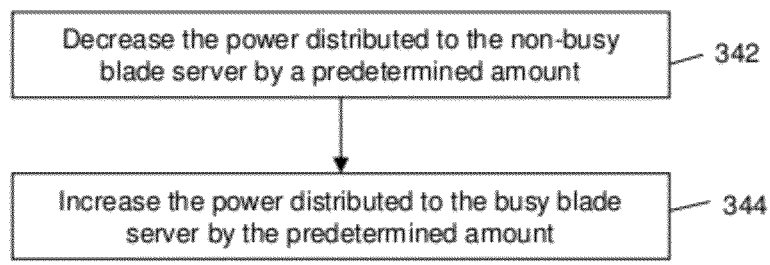
FIG. 3C is an example of a flow chart depicting redistribution of power to the blade servers based on the actual power consumption and status of the blade servers.

After the chassis management controller 200 distributes the remaining power to the plurality of blade servers, at 330, the chassis management controller 200 determines an actual power consumption of the plurality of blade servers, as described herein in connection with FIG. 3B. At 340, the chassis management controller 200 redistributes power to the plurality of blade servers based on the actual power consumption and the policy information, as described herein in connection with FIG. 3C.

Turning to FIG. 3B, a flow chart is shown depicting in more detail the operations associated with operation 330 in FIG. 3A to determine the actual power consumption of each of the plurality of blade servers and to determine the status of the blade servers. At 332, the chassis management controller 200 monitors the activity of each of the blade servers and classifies the blade servers as either "non-busy" or "busy". For example, the chassis management controller 200 may monitor the activity of each of the blade servers at periodic time intervals to measure an average actual power consumption for each blade server over the time interval. If the average actual power consumption for a blade server over the time interval is less than a predetermined percentage (for example, seventy five percent) of the power distributed or allocated to the blade server, the chassis management controller 200 will classify the blade server as a non-busy blade server. This is demonstrated by the equation below:

$$\overline{C}_{i,5} < P_{b_i} * 75/100 \qquad \text{(Equation 5), where}$$

$\overline{C}_{i,5}$ is the five second average consumption of blade server i. Similarly, if the average actual power consumption for the blade server over the time interval is more than a predetermined percentage (for example, ninety percent) of the power distributed or allocated to the blade server, the chassis management controller 200 will classify the blade server as a busy blade server. This is demonstrated by the equation below:

$$\overline{C}_{i,5} > P_{b_i} * 90/100 \qquad \text{(Equation 6), where}$$

$\overline{C}_{i,5}$ is the five second average consumption of blade server i.

At 334, the chassis management controller 200 determines whether there are any busy blade servers in the chassis unit, and at 336 determines whether there are any non-busy blade servers in the chassis unit based on the equations described above, for example. If there are both busy and non-busy blade servers, the chassis management controller, at 340, redistributes power from non-busy blade servers to the busy blade servers in accordance with the techniques described below. If there are not any busy blade servers or if there are not any non-busy blade servers, the chassis management controller reverts back to 332 to monitor the activity of each blade server, as described above.

Turning now to FIG. 3C, a flow chart is shown depicting in more detail the operations associated with operation 340 in FIG. 3A for the redistribution of power from non-busy blade servers to busy blade servers. In general, the chassis management controller 200 borrows power from non-busy blade servers and redistributes that power to busy blade servers. The chassis management controller 200, at 342, decreases the amount of power distributed to the non-busy blade server by a predetermined amount and, at 344, increases the amount of power distributed to the busy blade server by the same predetermined amount. In one example, only a constant amount of power (i.e., a power quantum) is used as the predetermined amount. Thus, power is reallocated or balanced from non-busy blade servers to busy blade servers for efficient allocation of power to the blade servers. In order to avoid unfair power allocation to blade servers that become busy earlier than other blade servers in a chassis unit, the chassis management controller 200 continuously monitors non-busy blade servers to determine if they should be reclassified as being busy. If a non-busy blade server later becomes busy, the chassis management controller 200 will immediately rebalance that blade server by redistributing power back to the blade server from the busy blade server which borrowed the predetermined amount of power from the non-busy blade server. A non-busy blade server may later be reclassified as a busy blade server in accordance with the following formula:

$$\overline{C}_{i,5} < P_{b_i} * 90/100, \text{ where}$$

$\overline{C}_{i,5}$ is the five second average consumption of blade server i.

Power can be redistributed or reallocated from any non-busy blade server within a chassis unit to a busy blade server within the same chassis unit. However, in one example, power is always redistributed first from non-busy blade servers that are within the same priority class as the busy blade servers, and if there are no non-busy blade servers in the same priority class, then power is reallocated from non-busy servers in other priority classes.

Turning now to FIG. 4, an example of the power redistribution between blade servers in different blade server priority classes is shown. In chassis unit 120(a) in FIG. 4., blade servers 122(a)(1) and 122(a)(2) are classified in a high blade server priority class 410, blade server 122(a)(3) is classified in a medium blade server priority class 420, and blade server 122(a)(4) is classified in a low blade server priority class 430. Blade servers 122(a)(2) and 122(a)(4) are designated by the chassis management controller 200 as busy blade servers, while blade servers 122(a)(1) and 122(a)(3) are designated by the chassis management controller 200 as non-busy blade servers, for example, as described above. Since busy blade server 122(a)(2) is also in the same priority class as non-busy blade server 122(a)(1), chassis management controller 200 redistributes a predetermined power amount or quantum (i.e., "lends" power) from non-busy blade server 122(a)(1) to busy blade serer 122(a)(2) Likewise, since busy blade server 122(a)(4) does not have any non-busy blade servers in the same priority class as itself, a non-busy blade server in a different priority class (i.e., blade server 122(a)(3)) lends a predetermined power amount or quantum to busy blade server 122(a)(4). If, for example, non-busy blade servers 122(a)(1) and 122(a)(3) later become busy, the chassis management controller 200 will redistribute the power quantum to these blade servers from busy blade servers 122(a)(2) and 122(a)(4), respectively, as described above.

Turning now to FIG. 5, an example block diagram of a plurality of blade servers 122(a)(1)-122(a)(4) residing in chassis 120(a) is shown. Each of the blade servers in FIG. 5 has a blade management controller 510 and a central processing unit (CPU) 520. There are other components in each of the blade servers as one ordinary skill in the art would appreciate, but for simplicity, those components are omitted in FIG. 5. The blade management controller 510 is configured to communicate with the chassis management controller 200 in order to regulate the power usage of each of the plurality of blade servers. In general, the blade management controller 510 regulates the power usage of each blade by monitoring the temperature of the CPU 520 and therefore the power consumption of the corresponding blade server, since the CPU thermal consumption is directly proportional to the power consumption of the blade server.

The blade management controller 510 has a configurable thermal threshold for each CPU 520 and will regulate the power usage of the CPU 520 based on the thermal reading of the CPU 520 (e.g., the CPU temperature) when compared to the thermal threshold for the CPU 520. To this end, there is a temperature sensor in or associated with the CPU 520 that supplies a temperature measurement to the blade management controller 510. For example, when the thermal reading of the CPU temperature exceeds the pre-determined threshold, the blade management controller 510 will lower the power usage of CPU 520. In order to regulate the power usage of each blade, the blade management controller 510 may manipulate a performance state (P-state) and a throttle state (T-state) of the CPU 520. By manipulating the P-state, the blade management controller 510 can increase or reduce the power consumption of the blade server. By manipulating the T-state, the blade management controller 510 can increase or reduce the thermal threshold for the CPU 520. In general, a lower P-state value for a CPU indicates a higher power consumption for the CPU, and a lower T-state value for a CPU indicates a higher thermal threshold (and thus a higher power threshold) for the CPU. For example, the blade management controller can increase the power consumption of the blade server by decreasing the P-state value associated with the CPU (i.e., "upgrading" the CPU power consumption). Similarly, the blade management controller can decrease the power consumption of the blade server by increasing the P-state value associated with the CPU (i.e., "downgrading" the CPU power consumption). Additionally, the blade management controller 510 may provide a power usage status to the chassis management controller 200 at frequent time intervals, and the chassis management controller 200 may use this power usage status information to monitor the actual power consumption of the respective blade servers, as described above.

FIG. 6 is an example of a flow chart describing processes that are executed by the blade management controller 510 to monitor the CPU temperature of each blade server at a configurable sampling interval and to adjust the CPU power by manipulating P-state and T-state values for the CPU. In FIG. 6, at 610, blade management controller 510 monitors the power usage and CPU temperature of each blade server. For example, the blade management controller 510 may monitor the power usage of the CPU 520 by determining a simple moving average (SMA) for the power usage of the CPU 520. The blade management controller 510 may also monitor the power usage of the CPU 520 by obtaining, for example, P-state information associated with the CPU 520, which may be retrieved, for example from a memory of the CPU 520 or from the CPU basic input/output system (BIOS). After the CPU power usage and temperature is monitored, the blade management controller 510, at 620, determines whether the power usage of the CPU 520 is greater than the power budget of the CPU 520. Since the power usage of the CPU 520 is directly related to the CPU temperature, this determination can be made by comparing the CPU temperature to a CPU temperature threshold, as described above. The blade management controller 510 makes this determination by, for example, comparing the SMA value of the CPU to threshold measurements such as a peak watts (PW) measurement (e.g., the maximum allowable power consumption threshold), a Normalized High Watts (NHW) measurement (e.g., an upper limit power consumption threshold related to a percentage of committed watts (CW) reserved for the CPU) and a Normalized Low Watts (NLW) measurement (e.g., a lower limit power consumption threshold related to a percentage of CW).

If the power usage of the CPU 520 is greater than the power budget for the CPU, the blade management controller 510, at 630, downgrades (reduces) the CPU power usage by, for example, increasing the CPU P-state value as described above. After downgrading the CPU power usage, the blade management controller, at 640, determines whether the new P-state value for the CPU is less than a maximum P-state value allowed for the CPU 520. If the new P-state value is not less than a maximum P-state value (i.e., if all P-state values have been used), the blade management controller 510, at 650, increases or throttles the CPU power budget by, for example, increasing the CPU temperature threshold by manipulating the T-state value for the CPU 520. For example, P-state value of the CPU 520 may have a maximum allowable value (indicating that the CPU has the lowest possible power usage) and may still be greater than the power budget. Thus, in order to allow the CPU 520 to operate under the CPU power budget, the blade management controller 510 increases or throttles the CPU power budget (for example, by manipulating the T-state value for the CPU 520). If the new P-state value of the CPU 520 is less than a maximum P-state value allowed for the CPU 520, the blade management controller 510 reverts back to 610 to monitor the CPU power usage and temperature.

If the power usage of the CPU 520 is not greater than the power budget of the CPU, (i.e., if the answer to step 620 in FIG. 6 is "no") the blade management controller 510, at 660, upgrades (increases) the CPU power usage by, for example, decreasing the CPU P-state value as described above. After upgrading the CPU power usage, the blade management controller 510 reverts back to 610 to monitor the CPU power usage and temperature.

The following pseudo-code further depicts the operations described in FIG. 7, above.

```
{
    If (SMA > PW) { /* If power usage more than peak watts. */
        downgrade_cpu( );
        if (current_pstate == Pn) { /* If all P-states are used */
            apply_tstate( );
        }
    }
    If (SMA > NHW) { /* if exceeds committed watts */
        downgrade_cpu( );
    }
    if (SMA < NLW) {
        upgrade_cpu( );
    }
    if (cpu_thermal_consumption > cpu_thermal_threshold) {
        downgrade_cpu( );
    }
}
where
PW = Peak Watts;
CW = Committed Watts;
CPR = Current Power Reading;
SMA: Simple Moving Average;
Normalized High Watts (NHW) = CW + (CW * X%);
Normalized Low Watts (NLW) = (CW − (CW * X%);
N: Number of samples collected between t and t + n; and
X: A tolerance percentage
```

In sum, a method is provided comprising: at a chassis management controller device in a chassis unit comprising a plurality of blade server devices, storing policy information for the chassis unit, wherein the policy information comprises power limit information that indicates a power budget for the chassis unit and blade server priority information that indicates priority for access to power for each of the plurality of blade servers in the chassis unit, distributing power to the plurality of blade servers based on the blade server priority information for each of the plurality of blade servers and the power limit information for the chassis unit, determining an actual power consumption of each of the plurality of blade servers and redistributing power to the plurality of blade servers based on the actual power consumption and the policy information.

In addition, an apparatus is provided comprising: a network interface device configured for communication with a management server, a power source interface device configured to receive power from a power source device, a blade interface device configured for communication with a plurality of blade servers, a memory and a processor. The processor is configured to be coupled to the network interface device, to the power source interface device and to the blade interface device. The processor is configured to: store in the memory policy information received from the management server for a chassis unit, wherein the policy information comprises power limit information that indicates a power budget for the chassis unit and blade server priority information that indicates priority for access to power for each of a plurality of blade servers in the chassis unit, distribute power from the power source to the plurality of blade servers based on the blade server priority information for each of the plurality of blade servers and the power limit information for the chassis unit, determine an actual power consumption of each of the plurality of blade servers and redistribute power to the plurality of blade servers based on the actual power consumption and the policy information.

Similarly, one or more computer readable storage media is provided that is encoded with software comprising computer executable instructions and when the software is executed operable to: store policy information for the chassis unit, wherein the policy information comprises power limit information that indicates a power budget for the chassis unit and blade server priority information that indicates priority for access to power for each of the plurality of blade servers in the chassis unit, distribute power to the plurality of blade servers based on the blade server priority information for each of the plurality of blade servers and the power limit information for the chassis unit, determine an actual power consumption of each of the plurality of blade servers and redistribute power to the plurality of blade servers based on the actual power consumption and the policy information.

The above description is intended by way of example only. Various modifications and structural changes may be made therein without departing from the scope of the concepts described herein and within the scope and range of equivalents of the claims.

What is claimed is:

1. A method comprising:
    at a chassis management controller device in a chassis unit comprising a plurality of blade servers, storing policy information for the chassis unit, wherein the policy information comprises:
        blade server priority information that indicates an assignment of each of the blade servers to one of a plurality of blade server priority classes having different priorities, and
        a power budget for the chassis unit that is based on the blade server priority classes of the plurality of blade servers such that chassis units with more blade servers assigned to higher priority classes are budgeted more power relative to other chassis units with fewer blade servers assigned to higher blade server priority classes;
    receiving, at the chassis unit, power at a power level substantially equal to the power budget for the chassis unit;
    at the chassis management controller device, distributing power to the plurality of blade servers based on the blade server priority class for each of the plurality of blade servers and the power budget for the chassis unit;
    at the chassis management controller device, determining an actual power consumption of each of the plurality of blade servers; and
    at the chassis management controller device, redistributing power to the plurality of blade servers based on the actual power consumption and the policy information.

2. The method of claim 1, wherein distributing comprises distributing power to the blade servers such that blade servers in the same blade server priority class receive an equal amount of power.

3. The method of claim 1, wherein distributing comprises distributing power to the blade servers based on a number of blade slots in the chassis unit occupied by each of the blade servers such that blade servers that occupy multiple blade slots receive more power than blade servers that occupy a single blade slot.

4. The method of claim 1, further comprising monitoring, at the chassis management controller device, activity of each of the blade servers and classifying the blade servers as non-busy or busy based on the monitoring, and wherein redistributing comprises:
    decreasing power distributed to non-busy servers by a predetermined amount; and
    increasing power distributed to busy blade servers by the predetermined amount.

5. The method of claim 4, wherein redistributing comprises redistributing power to the one or more busy blade servers from non-busy blade servers that are within the same blade server priority class as one or more busy blade servers.

6. The method of claim 1, wherein distributing comprises distributing power to the blade servers of the chassis unit such that blade servers with a higher relative priority within the chassis unit receive more power from the chassis management controller device than blade servers with a lower relative priority.

7. The method of claim 1, further comprising reserving a predetermined amount of power from the power budget for cooling the chassis unit prior to distributing power to the plurality of blade servers and wherein distributing comprises distributing power to the plurality of blade servers based on an amount of power remaining in the power budget after reserving the predetermined amount of power.

8. The method of claim 1, further comprising receiving the policy information from a management server.

9. The method of claim 8, further comprising:
    at the management server, defining a chassis group comprising two or more chassis units each comprising a plurality of blade servers;
    assigning each of the plurality of blade servers in each of the two or more chassis units to one of a plurality of blade server priority classes;
    setting a power budget for each of the chassis units of the chassis group based on the blade server priority classes associated with the plurality of blade servers in each of the two or more chassis units; and
    sending the power budget to the chassis management controller device of each of the chassis units in the chassis group.

10. The method of claim 9, wherein setting comprises setting the power budget for each chassis unit of the chassis group such that chassis units with more blade servers in a higher blade server priority class are allocated more power relative to chassis management controller devices with fewer blade servers in the higher blade server priority class.

11. The method of claim 1, wherein redistributing power comprises:
    monitoring power usage of a computer processing unit (CPU) of a blade server;
    comparing the monitored power usage of the CPU to a power budget for the CPU; and
    updating a performance state value associated with the CPU based on the comparing and distributing power to the CPU based on the performance state value.

12. The method of claim 11, further comprising reducing the power to the CPU if the monitored power usage of the CPU is greater than the power budget of the CPU.

13. The method of claim 11, further comprising increasing the power to the CPU if the monitored power usage of the CPU is less than the power budget of the CPU.

14. One or more non-transitory computer readable storage media encoded with software comprising computer executable instructions and when the software is executed operable to:

store policy information at a chassis management controller device in a chassis unit comprising a plurality of blade servers, wherein the policy information comprises:
  power limit information blade server priority information that indicates an assignment of each of the blade servers to one of a plurality of blade server priority classes having different priorities, and
  a power budget for the chassis unit that is based on the blade server priority classes of the plurality of blade servers such that chassis units with more blade servers assigned to higher priority classes are budgeted more power relative to other chassis units with fewer blade servers assigned to higher blade server priority classes;
distribute power to the plurality of blade servers based on the blade server priority class for each of the plurality of blade servers and the power budget for the chassis unit;
determine an actual power consumption of each of the plurality of blade servers; and
redistribute power to the plurality of blade servers based on the actual power consumption and the policy information.

15. The non-transitory computer readable storage media of claim 14, wherein the instructions operable to distribute power comprise instructions operable to distribute power to the blade servers such that blade servers in a same blade server priority class receive an equal amount of power.

16. The non-transitory computer readable storage media of claim 14, wherein the instructions operable to distribute power comprise instructions operable to distribute power to the blade servers based on a number of blade slots in the chassis unit occupied by each of the blade servers such that blade servers that occupy multiple blade slots receive more power than blade servers that occupy a single blade slot.

17. The non-transitory computer readable storage media of claim 14, further comprising computer executable instructions operable to monitor activity of each of the blade servers and classify the blade servers as non-busy or busy based on the monitoring, and wherein the instructions operable to redistribute power to the plurality of blade servers comprise instructions operable to:
  decrease power distributed to non-busy servers by a predetermined amount; and
  increase power distribution to busy blade servers by the predetermined amount.

18. The non-transitory computer readable storage media of claim 14, wherein the instructions operable to distribute power comprise instructions operable to distribute power to the blade servers of the chassis unit such that blade servers with a higher relative priority within the chassis unit receive more power than blade servers with a lower relative priority.

19. An apparatus comprising:
a network interface device configured for communication over a network with a management server;
a power source interface device configured to receive power from a power source device;
a blade interface device configured for communication with a plurality of blade servers in a chassis unit;
a memory; and
a processor configured to be coupled to the network interface device, the power source interface device and the blade interface device, wherein the processor is configured to:
  store in the memory policy information received from the management server for a chassis unit, wherein the policy information comprises:
    blade server priority information that indicates an assignment of each of the blade servers to one of a plurality of blade server priority classes having different priorities, and
    a power budget for the chassis unit that is based on the blade server priority classes of the plurality of blade servers such that chassis units with more blade servers assigned to higher priority classes are budgeted more power relative to other chassis units with fewer blade servers assigned to higher blade server priority classes;
  distribute power from the power source to the plurality of blade servers based on the blade server priority class for each of the plurality of blade servers and the power budget for the chassis unit;
  determine an actual power consumption of each of the plurality of blade servers; and
  redistribute power to the plurality of blade servers based on the actual power consumption and the policy information.

20. The apparatus of claim 19, wherein the processor is further configured to:
  monitor activity of each of the blade servers;
  classify the blade servers as non-busy or busy based on the monitoring;
  decrease power distributed to non-busy servers by a predetermined amount; and
  increase power distributed to busy blade servers by the predetermined amount.

21. The apparatus of claim 20, wherein the processor is further configured to redistribute power to the plurality of blade servers from the non-busy blade servers that are within a same blade server priority class as the one or more busy blade servers.

* * * * *